United States Patent
Park

(10) Patent No.: US 12,068,424 B2
(45) Date of Patent: Aug. 20, 2024

(54) THERMAL CONDUCTIVE AND ELECTRICALLY INSULATING PAINT COMPOSITION, AND EXTERIOR STEEL SHEET FOR SOLAR CELL COMPRISING SAME

(71) Applicant: POSCO, Pohang-si (KR)

(72) Inventor: Young-Jun Park, Gwangyang-si (KR)

(73) Assignee: POSCO CO., LTD, Pohang-si (KR)

( * ) Notice: Subject to any disclaimer, the term of this patent is extended or adjusted under 35 U.S.C. 154(b) by 171 days.

(21) Appl. No.: 17/619,999

(22) PCT Filed: May 29, 2020

(86) PCT No.: PCT/KR2020/006951
§ 371 (c)(1),
(2) Date: Dec. 16, 2021

(87) PCT Pub. No.: WO2020/256307
PCT Pub. Date: Dec. 24, 2020

(65) Prior Publication Data
US 2022/0367742 A1    Nov. 17, 2022

(30) Foreign Application Priority Data
Jun. 20, 2019   (KR) .................. 10-2019-0073545

(51) Int. Cl.
*H01L 31/052*   (2014.01)
*B32B 15/18*   (2006.01)
(Continued)

(52) U.S. Cl.
CPC .......... *H01L 31/052* (2013.01); *B32B 15/18* (2013.01); *H01B 3/30* (2013.01); *C09D 5/00* (2013.01);
(Continued)

(58) Field of Classification Search
CPC ............... B32B 2255/06; B32B 15/18; B32B 15/08–098; H01L 31/052; H01L 31/048–049
See application file for complete search history.

(56) References Cited

U.S. PATENT DOCUMENTS

2007/0265379 A1\* 11/2007 Chen ..................... C08K 7/24
524/495
2011/0263779 A1\* 10/2011 Murofushi ............. C08L 33/06
524/847

(Continued)

FOREIGN PATENT DOCUMENTS

| CN | 102544380 | 7/2012 |
| CN | 107043591 | 8/2017 |

(Continued)

OTHER PUBLICATIONS

Machine translation of CN107043591A (Year: 2017).\*

(Continued)

*Primary Examiner* — Ryan S Cannon
(74) *Attorney, Agent, or Firm* — CANTOR COLBURN LLP

(57) ABSTRACT

Provided is a thermally conductive and electrically insulating paint composition, and an exterior steel sheet for a solar cell, comprising same. Specifically, the thermally conductive and electrically insulating paint composition includes: a first mixture, which comprises a thermoplastic resin and a thermally conductive filler, a polymer dispersant, and a first hydrocarbon-based solvent; and an exterior steel sheet for a solar cell, comprising: a steel sheet on which a heat dissipation layer is formed on one surface thereof; and a thermally conductive and electrically insulating coating layer which comprises a thermoplastic resin, a thermally conductive filler and a polymer dispersant, and which is formed on the other surface of the steel sheet, wherein the thermally (Continued)

conductive filler is dispersed in the coating layer in a form of being encompassed by the polymer dispersant.

4 Claims, 2 Drawing Sheets

(51) Int. Cl.
*H01B 3/30* (2006.01)
*C09D 5/00* (2006.01)
*C09D 7/61* (2018.01)
*C09D 175/04* (2006.01)
*C09D 177/00* (2006.01)

(52) U.S. Cl.
CPC ............ *C09D 7/61* (2018.01); *C09D 175/04* (2013.01); *C09D 177/00* (2013.01)

(56) References Cited

U.S. PATENT DOCUMENTS

| 2015/0068593 | A1* | 3/2015 | Kim ..................... B32B 37/02 156/306.6 |
| 2018/0106562 | A1 | 4/2018 | Hwang et al. |
| 2018/0134937 | A1* | 5/2018 | Ellett ..................... C09K 5/14 |
| 2018/0251639 | A1 | 9/2018 | Hinatsu et al. |

FOREIGN PATENT DOCUMENTS

| JP | 2004067889 A * | 3/2004 |
| JP | 2008091440 | 4/2008 |
| KR | 20120089935 | 8/2012 |
| KR | 101279679 | 6/2013 |
| KR | 101505746 | 3/2015 |
| KR | 101650508 | 8/2016 |
| KR | 20160097058 | 8/2016 |
| KR | 20160120685 | 10/2016 |
| KR | 101782441 | 9/2017 |
| KR | 20180004174 | 1/2018 |
| KR | 20180009990 | 1/2018 |
| KR | 20180048841 | 5/2018 |
| KR | 20180049207 | 5/2018 |
| KR | 20180067455 | 6/2018 |
| KR | 101969151 | 4/2019 |
| WO | 2004106420 | 12/2004 |
| WO | 2011132748 | 10/2011 |

OTHER PUBLICATIONS

Machine translation of KR-101505746B1 (Year: 2015).*
Machine translation of KR-20120089935A (Year: 2012).*
Machine translation of JP2004-067889A (Year: 2004).*
Machine translation of KR101279679B1 (Year: 2013).*
Chinese Office Action—Chinese Application No. 202080044865.1 issued on Aug. 3, 2022, citing CN 107043591, KR 10-2012-0089935, KR 10-1279679, and CN 102544380.
European Search Report—European Application No. 20825790.7 issued on Jul. 18, 2022, citing WO 2004-106420, WO 2013-069468, KR 10-2018-0009990, and KR 10-2012-0089935.
International Search Report—PCT/KR2020/006951 dated Nov. 24, 2020.
Japanese Office Action—Japanese Application No. 2021-574819 issued on Jan. 10, 2023, citing CN 107043591, JP 2008-091440, KR 10-1969151, and WO 2011/132748.
Chinese Office Action—Chinese Application No. 202080044865.1 issued on Jul. 30, 2023, citing Nass.
Nass, Encyclopedia of PVC, Chemical Industry Press, Aug. 31, 1987, 1st Edition, vol. 3, pp. 775-776.
Chinese Office Action—Chinese Application No. 202080044865.1 issued on Nov. 14, 2023, citing Jiao.
Jiao, Handbook Of Coatings Additives, 1st version, Shanghai Scientific and Technological Literature Press, p. 421, May 31, 2000.

* cited by examiner (a)

(b)

THERMAL CONDUCTIVE AND ELECTRICALLY INSULATING PAINT COMPOSITION, AND EXTERIOR STEEL SHEET FOR SOLAR CELL COMPRISING SAME

TECHNICAL FIELD

The present disclosure relates to a thermal conductive and electrically insulating paint composition and an exterior steel sheet for a solar cell including the same.

BACKGROUND ART

Solar cells, especially copper indium gallium selenide (CIGS) thin film-type solar cells including stainless steel substrates, are flexible and lightweight, and are widely used for building integrated photovoltaic (BIPV) applications by combining solar cells with exterior materials (e.g., roofing materials or exterior walls) of buildings.

In this case, the solar cell combined with the exterior material of the building not only receives sunlight to produce electricity, but also converts some of the light energy into heat to increase a temperature of the solar cell. When the temperature increases, efficiency of the solar cell decreases, so the generated heat must be effectively dissipated externally.

However, in the CIGS solar cell including a stainless substrate, it is difficult to effectively dissipate heat generated due to a back sheet having a plastic material below the stainless substrate, so that it is reported that a temperature of a surface of the solar cell may increase up to 70 to 80° C. in the summer, and power generation efficiency of the solar cell may rapidly decrease.

PRIOR ART DOCUMENT

Patent Document 1

(Patent Document 1) Korean Patent No. 10-1782441

DISCLOSURE

Technical Problem

The present disclosure is to solve a rapid decrease in power generation efficiency of solar cells as described above. The present disclosure provides a thermal conductive and electrically insulating paint composition having excellent thermal conductivity and electrical insulation properties, and an exterior steel sheet for a solar cell capable of effectively dissipating heat generated by the solar cell by providing a steel sheet having a coating layer formed of the paint composition on one surface and a heat dissipation layer on the other surface of a galvanized steel sheet containing Mg having excellent corrosion resistance.

Technical Solution

According to an aspect of the present disclosure, a thermal conductive and electrically insulating paint composition is provided. The thermal conductive and electrically insulating paint composition includes: a first mixture, including a thermoplastic resin and a thermal conductive filler; a polymeric dispersant; and a first hydrocarbon-based solvent.

According to another aspect of the present disclosure, an exterior steel sheet for a solar cell is provided. The exterior steel sheet for a solar cell includes: a steel sheet having a heat dissipation layer formed on one surface thereof; and a thermal conductive and electrically insulating coating layer including a thermoplastic resin, a thermal conductive filler and a polymeric dispersant, which is formed on the other surface of the steel sheet, wherein the thermal conductive filler is dispersed in a coating layer in a form of being encompassed by the polymeric dispersant.

Advantageous Effects

As set forth above, when a thermal conductive and electrically insulating conductive paint composition prepared with a coating composition by the present disclosure is coated on a heat-dissipating steel sheet and combined with a solar cell, heat of the solar cell may be effectively conducted and released to suppress an increase in a temperature of the solar cell, and efficiency of the solar cell may be improved by providing an insulating effect.

BEST MODE FOR INVENTION

Figure 1:
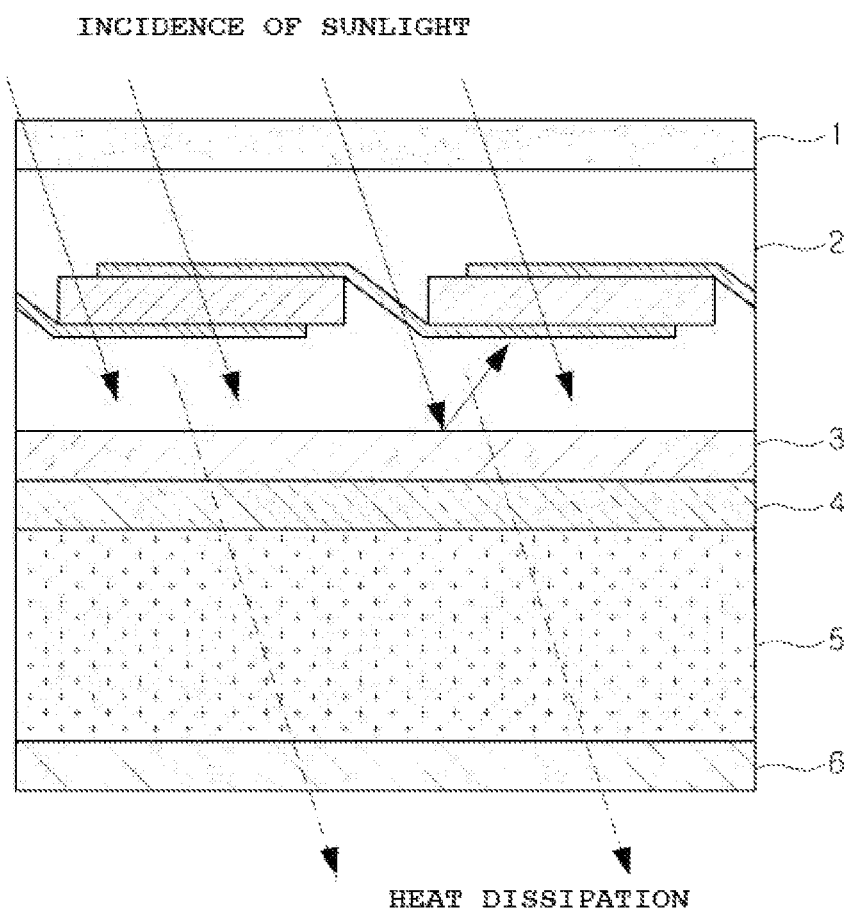
FIG. 1 illustrates a cross-sectional view fora solar cell to which an exterior steel sheet for a solar cell manufactured according to an embodiment of the present disclosure is adhered.
Figure 2:
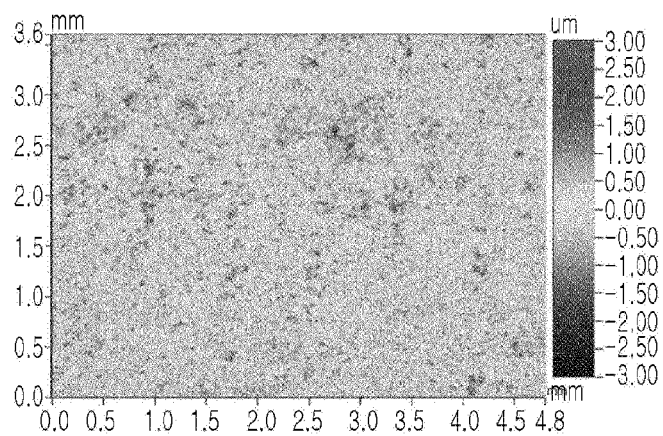
FIG. 2 is a photograph of a surface of a coating layer formed of a heat dissipation paint composition of the present disclosure on a galvanized steel sheet observed with a three-dimensional roughness meter, (a) illustrates Comparative Example 1, (b) illustrates Example 2.
Figure 2:
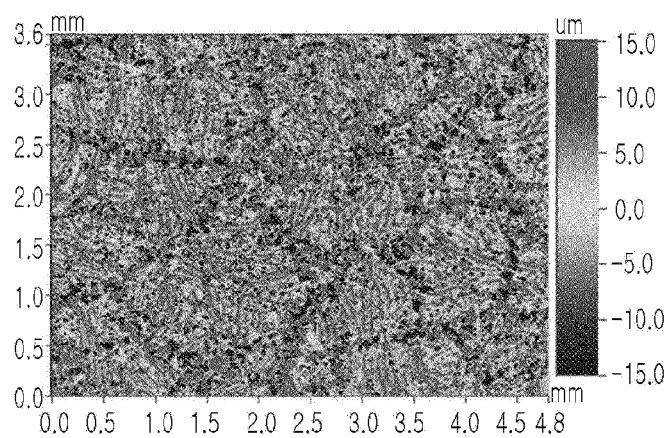

Hereinafter, the present disclosure will be described in detail. The present disclosure may, however, be exemplified in many different forms and should not be construed as being limited to the specific embodiments set forth herein.

The present disclosure provides a thermal conductive and electrically insulating conductive paint composition for providing an exterior material for a solar cell capable of blocking a flow of electricity generated by a solar cell and dissipating only heat.

Specifically, the present disclosure provides a thermal conductive and electrically insulating paint composition including a first mixture including a thermoplastic resin and a thermal conductive filler, a polymeric dispersant, and a first hydrocarbon-based solvent.

In this case, the first mixture may include 95 to 99% by weight of a thermoplastic resin and 1 to 5% by weight of a thermal conductive filler, based on a weight of the first mixture. When a content of the thermoplastic resin is less than 95% by weight, there may be a problem in that adhesive strength of a coating layer formed of the thermal conductive and electrically insulating paint composition decreases, and when the content of the thermoplastic resin exceeds 99% by weight, thermal conductivity may be significantly reduced. In addition, when a content of the thermal conductive filler is less than 1% by weight, thermal conductivity may be significantly reduced, and when the content of the thermal conductive filler exceeds 5% by weight, there is a problem in that adhesive strength of a coating layer formed of the thermal conductive and electrically insulating paint composition decreases.

The thermoplastic resin is used to provide adhesive strength to a coating layer formed of a thermal conductive and electrically insulating paint composition, and has a softening point of 100 to 150° C. In this case, the softening point was measured by a Vicat softening point test (ASTM D1525). When the softening point of the thermoplastic resin is lower than 100° C., when a temperature of the solar cell rises to 80° C. or higher in summer, a solar cell layer and an adhesive layer may be peeled off, and when the softening point of the thermoplastic resin is higher than 150° C., an energy required for attachment to the solar cell by heating an exterior material for a solar cell may be excessively consumed, and a heat dissipation coating layer formed on the exterior material for a solar cell by high heat, and heat dissipation properties may be reduced due to deterioration of the heat dissipation coating layer and a change in corrugations.

Furthermore, the thermoplastic resin may be at least one selected from a group consisting of polyurethane, polyamide, and an acrylic resin, but is not limited thereto, and may be used alone or in a combination of two or more thereof, if necessary.

In addition, the thermal conductive filler may be at least one selected from a group consisting of carbon black, boron nitride, and graphite, but is not limited thereto, and may be used alone or in a combination of two or more thereof, if necessary.

Meanwhile, the polymeric dispersant is attached to a surface of the thermal conductive filler to prevent direct contact between the fillers to prevent electricity from passing, and the polymer dispersant may be included in an amount of 1 to 3 parts by weight per 100 parts by weight of the thermal conductive filler, and when the content of the polymeric dispersant is less than 1 part by weight, there may be a problem in that the thermal conductive fillers agglomerate and an electrical insulation effect is reduced. When the content of the polymeric dispersant exceeds 3 parts by weight, an excessive polymer dispersant is separated from the thermoplastic resin to form another phase, which may cause a problem in that adhesive strength of the thermoplastic resin to the steel sheet is lowered.

In this case, the polymeric dispersant may be at least one from a group consisting of Antiterra-U, P104, Disperbyk 110, Disperbyk 130, Disperbyk 160, Disperbyk 170 Family, EFKA 776, EFKA 4050, EFKA 4063, EFKA 4051, Solsperse 24000, Solsperse 36600, Solsperse 32600, Solsperse 22000, Solsperse 12000, and Solsperse 5000s, but is not limited thereto, and for example, Lubrizol's Solsperse 5000S, Solsperse 12000 or Solsperse 22000 may be used. The Solsperse 5000S, Solsperse 12000, or Solsperse22000 dispersants are adsorbed to a thermal conductive filler and, in addition to an effect of dispersing the filler in a solvent, a molecular structure thereof is bulky so that the fillers do not contact each other within the coating layer, thereby significantly increasing the effect of improving electrical insulation properties.

Among the dispersants, Solsperse 5000S has a molecular formula of C70H95CuN9O3S, and a weight average molecular weight is a polymeric material having a weight average molecular weight of approximately 1200 (1206.1728) and has a structure as shown in Formula 1 below. Solsperse 12000 and Solsperse 22000 are similar compounds to Solsperse 5000S and have a higher molecular weight than Solsperse 5000S.

[Chemical formula 1]

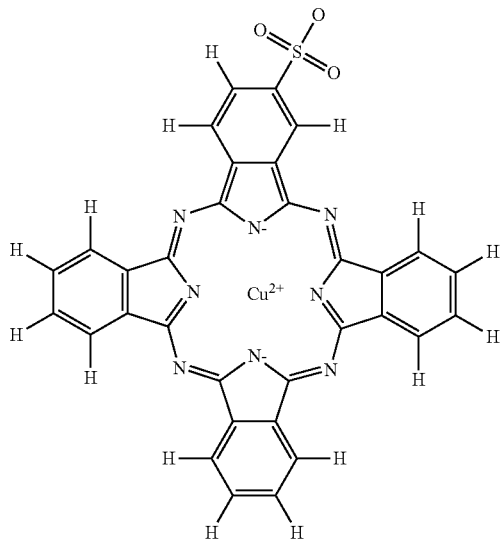

The first hydrocarbon-based solvent may be at least one selected from a group consisting of cyclohexane, toluene and xylene, but is not limited thereto, and cyclohexane may preferably be used. Furthermore, the first hydrocarbon-based solvent may be included in an amount of 50 to 70 parts by weight per 100 parts by weight of the thermoplastic resin, and when a content of the thermoplastic resin is less than 50 parts by weight, there may be a problem that it is difficult for the thermoplastic resin to be coated on a surface of the steel sheet due to high viscosity, and when the content of the thermoplastic resin exceeds 70 parts by weight, the content of the thermoplastic resin, the thermal conductive filler and the polymeric dispersant is relatively small, so that adhesive strength, thermal conductivity, and electrical insulation properties of the coating layer formed of the paint composition may be significantly reduced.

Meanwhile, the present disclosure provides an exterior steel sheet for a solar cell including a coating layer formed of the thermal conductive and electrically insulating paint composition.

In detail, an exterior steel sheet for a solar cell is provided. The exterior steel sheet for a solar cell includes: a steel sheet having a heat dissipation layer formed on one surface thereof; and a thermal conductive and electrically insulating coating layer including a thermoplastic resin, a thermal conductive filler and a polymeric dispersant, which is formed on the other surface of the steel sheet, wherein the thermal conductive filler is dispersed in a coating layer in a form of being encompassed by the polymeric dispersant.

In this case, the coating layer may be formed of a thermal conductive and electrically insulating paint composition of the present disclosure.

Furthermore, in the coating layer, a weight ratio of the thermoplastic resin and the thermal conductive filler may be 99:1 to 95:5, and the polymeric dispersant may be included in an amount of 1 to 3 parts by weight per 100 parts by weight of the thermal conductive filler.

The steel sheet may be a galvanized steel sheet including a plating layer containing Mg, wherein the Mg content may be 0.5 to 5% by weight, compared to the plating layer, and in order to improve corrosion resistance of the steel sheet, the Mg content may be 0.5 to 5% by weight, preferably 1.5 to 3% by weight, based on a total weight of the plating layer. When the Mg content is less than 0.5% by weight, an effect of improving the corrosion resistance of the steel sheet is insignificant, and when the Mg content exceeds 5% by weight, it may be impossible to manufacture a plating bath due to oxidation of a surface of the plating bath.

In this case, a remainder of the plating layer may be any composition known in the art, for example, the remainder may be Zn or Al, but is not limited thereto.

Specifically, the galvanized steel sheet containing Mg in the plating layer may be a ternary galvanized steel sheet in which a plating layer is composed of Mg/Al/Zn. More specifically, the plating layer may be 0.5 wt % to 5 wt % of Mg, preferably 1.5 wt % to 3 wt %, Al may be 1.5 wt % to 11 wt %, and a remainder of Zn.

Furthermore, the heat dissipation layer may be a coating layer may include a second mixture including an oligomer having a hydroxyl group or a carboxyl group and an amino curing agent, an acid catalyst, and an anisotropic filler.

In this case, the coating layer may be a coating layer formed of a heat dissipation paint composition including a second mixture including an oligomer having a hydroxyl group or a carboxyl group and an amino curing agent, an acid catalyst, an anisotropic filler, and a second hydrocarbon-based solvent.

The oligomer having a hydroxyl group or a carboxyl group reacts with a curing agent to form a coating layer, and serves to orient an anisotropic filler in a vertical direction in a process thereof. For example, an oligomer containing a hydroxyl group among the oligomers may use any one of JONCRYL® 500, 507, 508, 550, or 963 manufactured by BASF, and an oligomer containing a carboxy group among the oligomers may use any one of JONCRYL® 586, 611, or 67 manufactured by BASF, but is not limited thereto. If necessary, the oligomers may be used alone or in a combination of two or more.

In this case, the oligomer may have a weight average molecular weight of 1,000 to 3,000 g/mol, and may be included in an amount of 65 to 75% by weight based on the second mixture.

When a weight average molecular weight of the oligomer is less than 1,000 g/mol, flexibility of the heat dissipation layer and adhesive strength to the steel sheet may be reduced. When the weight average molecular weight of the oligomer exceeds 3,000 g/mol, it is difficult to perform roll coating on the steel sheet due to high viscosity, which may cause a problem of poor continuity of production. In addition, when a content of the oligomer is less than 65% by weight, it is cured more than necessary and the flexibility of the heat dissipation layer may be reduced. When the content of the oligomer exceeds 75% by weight, a degree of curing of the heat dissipation layer is lowered, so that solvent resistance, corrosion resistance, or the like, are lowered, and it may be difficult to secure sufficient adhesion.

The amino curing agent reacts with an oligomer to harden the oligomer when coating the heat dissipation paint composition on the steel sheet. An amino curing agent used in the art may be used, for example, Resimenel 745, 747 by Ineos, or Cymel by Allnex. 301, 303LF, or BASF's Luwipal 066 may be used, but is not limited thereto.

The curing agent may be included in an amount of 25 to 35% by weight based on a total weight of the second mixture. When a content of the curing agent is less than 25% by weight, a degree of curing the heat dissipation layer is lowered, and solvent resistance, corrosion resistance, or the like, are lowered, which may cause a problem in that it is difficult to secure sufficient adhesion. When the content of the curing agent exceeds 35% by weight, it may be cured more than necessary, and there may be a problem in that the flexibility of the heat dissipation layer is lowered.

Meanwhile, the acid catalyst serves to speed up a curing rate of the coating layer, and the acid catalyst may be paratoluenesulfonic acid (Nacure 2500 or 2547 manufactured by King Industries), but is not limited thereto.

In this case, the acid catalyst may be included in an amount of 0.5 to 1.5 parts by weight per 100 parts by weight of the second mixture. In this case, when a content of the acid catalyst is less than 0.5 parts by weight, since a curing rate of the heat dissipation layer is low even when roll coating is performed, the heat dissipation layer is not cured, which may cause a problem in that mass production may not be performed. When the content of the acid catalyst exceeds 1.5% by weight, storage stability of a heat dissipation pain composition is lowered, which may cause a problem in that the composition may be gelated during long-term storage.

Furthermore, the anisotropic filler serves to form corrugations in a coating layer formed of a heat dissipation paint composition, and graphite or hexagonal boron nitride may be used, but is not limited thereto, and a lengthwise size of the anisotropic filler may be determined in consideration of a height of the corrugation of the coating layer formed of the heat dissipation paint composition, and a filler having an aspect ratio of 3 or more may be used.

In this case, the anisotropic filler may include 1 to 4 parts by weight per 100 parts by weight of the second mixture. When a content of the anisotropic filler is less than 1 part by weight, there may be a problem that may not exhibit sufficient heat dissipation performance. When the content of the anisotropic filler exceeds 4 parts by weight, there may be a problem in that the adhesive strength, corrosion resistance, or the like of a coating film are deteriorated due to an excessive amount of filler.

In addition, the second hydrocarbon-based solvent may be at least one selected from a group consisting of cyclohexane, toluene and xylene, but is not limited thereto, and preferably cyclohexane may be used, and furthermore, if necessary, the second hydrocarbon-based solvent may include additives such as adhesive strength promoters, rust preventives, lubricants, antifoaming agents, and the like, which may be generally blended into a steel sheet coating composition. In this case, the second hydrocarbon-based solvent may be included in an amount of 20 to 30 parts by weight per 100 parts by weight of the second mixture.

Meanwhile, the exterior steel sheet for a solar cell may be provided by coating the thermal conductive and electrically insulating paint composition and the heat dissipation paint composition on the steel sheet described above, and a thickness of the coating layer formed of the thermal conductive and electrically insulating paint composition may be 5 to 10 µm, and a thickness of the coating layer (heat dissipation layer) formed of the heat dissipation paint composition may be 10 to 30 µm. In this case, the heat dissipation layer has corrugations protruding outwardly of the steel sheet in a thickness direction, and includes an anisotropic filler in the protruding corrugations, and the anisotropic filler may be oriented outwardly of the steel sheet in the thickness direction.

For example, the anisotropic filler included in the heat dissipation paint composition may be oriented in a vertical direction of the steel sheet according to formation of corrugations during a curing process after the heat dissipation paint composition is coated on the steel sheet, thereby forming corrugations in the coating layer formed of the heat dissipation paint composition.

Accordingly, the anisotropic filler of the heat dissipation layer may be oriented to follow a protrusion direction of the corrugations, for example, the anisotropic filler may be oriented at an angle of 30 degrees to 90 degrees, preferably an angle of 50 to 90 degrees, and more preferably an angle of 60 to 90 degrees, in a thickness direction with respect to a surface of the steel sheet, so that the anisotropic filler may exist in an upright?) state on a surface of the coating layer.

In this case, when a thickness of a coating layer formed of a thermal conductive and electrically insulating paint composition is less than 5 µm, it may be difficult to exhibit sufficient adhesion and thus it may be difficult to fix the solar cell and the steel sheet, and when the thickness of the coating layer exceeds 10 µm, thermal resistance may increase, which may cause a problem in that it is difficult to conduct heat generated by the solar cell to the steel sheet. Furthermore, when the thickness of the coating layer formed of a heat-dissipating paint composition is less than 10 µm, sufficient corrugations may not be formed and heat dissipation performance may be lowered, and when exposed to outdoors for a long time, the coating layer may be deteriorated, causing a coating film to fall off and corrosion to easily occur. When the thickness of the coating layer exceeds 30 µm, it is difficult to dry the coating layer, and heat resistance may increase, thereby reducing heat dissipation performance.

Meanwhile, the present disclosure may provide a solar cell to which the exterior steel sheet for a solar cell is attached.

The solar cell may be formed of a CIGS thin film solar cell made of a stainless steel substrate, a thermal conductive and electrically insulating coating layer, a steel sheet, and a heat dissipation coating layer, and a solar cell may be manufactured in a form in which the thermal conductive and electrically insulating coating layer is adhered to the solar cell. However, the solar cell is not limited thereto.

FIG. 1 is a cross-sectional view for a solar cell including a thermal conductive and electrically insulating coating layer and a heat dissipation coating layer. Thereamong, a protective film 1 may have a thickness of 100 µm or less, a solar cell layer 2 containing CIGS may have a thickness of 100 to 300 µm, a stainless substrate may have a thickness of 50 to 100 µm, the thermal conductive and electrically insulating coating layer may have a thickness of 5 to 10 µm, a plated steel sheet 5 may have a thickness of 0.5 to 1 mm, and the heat dissipation coating layer may have a thickness of 10 to 30 µm.

Hereinafter, the present disclosure will be described in more detail through specific examples. The following examples are only examples to help the understanding of the present disclosure, and the scope of the present disclosure is not limited thereto.

MODE FOR INVENTION

Example

Example 1

(1) Preparation of Thermal Conductive and Electrically Insulating Paint Composition After adding 0.02 g of Solsperse 5000S as a polymeric dispersant to 66 g of cyclohexane and stirring, 1 g of carbon black having an average particle size of 3 to 5 µm was added and stirred to create a state in which a surface of the carbon black is encompassed by the polymeric dispersant. Thereafter, 99 g of a polyamide resin was added thereto and uniformly stirred to obtain a thermal conductive and electrically insulating paint composition with adhesive strength.

(2) Preparation of Heat Dissipation Paint Composition

In a mixture of 80 g of an oligomer containing a hydroxyl group (JONCRYL® 611, BASF), 20 g of an amino curing agent (Luwipal 066, BASF), and 25 g of cyclohexane, 1 g of a graphite filler having an average particle size of 8 to 10 µm and an aspect ratio of 4.5 was added and then uniformly stirred. Thereafter, 1 g of an acid catalyst (Nacure 2547, King Industries) was added and stirred to obtain a heat dissipation paint composition.

(3) Preparation of Exterior Steel Sheet for Solar Cell

One surface of a galvanized steel sheet containing Mg was coated with a thermal conductive and electrically insulating paint composition prepared as described above with a roll coater, and the other surface thereof was coated with a heat dissipation paint composition, and then heated so that a temperature of the steel sheet was 200 to 250° C. Thus, an exterior steel sheet for a solar cell was prepared.

In this case, a thickness of a coating layer formed of the thermal conductive and electrically insulating paint composition was 7 to 8 µm, and a thickness of a coating layer formed of the heat dissipation paint composition was 25 to 28 µm.

(4) Preparation for a Solar Cell With Excellent Thermal Conductivity and Heat Dissipation Properties Among the steel sheets for a solar cell prepared in (3), a surface coated with a thermal conductive and electrically insulating paint composition was closely attached to face a stainless substrate of a CIGS thin film solar cell, and the exterior steel sheet for a solar cell was attached to the CIGS thin film solar cell so that a surface coated with the heat dissipation paint composition was exposed to the atmosphere.

Thereafter, a temperature of the coated steel sheet was heated to 100 to 150° C. by performing induction heating so that the exterior steel sheet for a solar cell is adhered to the solar cell, and simultaneously, a predetermined pressure was applied.

Example 2

In the Example 1, a solar cell was manufactured in the same manner as in Example 1 except that polyurethane is used as a thermoplastic resin and boron nitride as a thermal conductive filler were used when the thermal conductive and electrically insulating paint composition was manufactured, an oligomer having a carboxy group instead of an oligomer having a hydroxy group was used when the heat dissipation paint composition was manufactured.

Comparative Examples 1 and 2

In the Example 1, as described in Table 1 below, a solar cell was manufactured in the same manner as in Example 1 except that a thermal conductive and electrically insulating paint composition with a modified thermoplastic resin, a thermal conductive filler, and a polymeric dispersant, and a heat dissipation paint composition with a modified oligomer, an amino curing agent and an anisotropic filler were used, and a ternary plated steel sheet containing Al—Mg—Zn was used as the steel sheet coated with the thermal conductive and electrical insulating paint composition and the heat dissipation paint composition.

TABLE 1

| Classification | Thermal conductive and electrically insulating paint composition | | | Heat dissipation paint composition | | Reference |
|---|---|---|---|---|---|---|
| | Thermoplastic resin | Thermal conductive filler | Polymeric dispersant | Oligomer/Amino curing agent | Anisotropic filler | |
| Example 1 | Polyamide | Insulation Carbon Black | Solsperse 5000S | Oligomer having a hydroxyl group/Amino curing agent | Graphite | Insulation, formation of corrugations |
| Example 2 | Polyurethane | Insulation Boron Nitride | Solsperse 5000S | Oligomer having a carboxyl group/Amino curing agent | Graphite | Insulation, formation of corrugations |
| Comparative example 1 | Polyamide | General Carbon Black | — | Epoxy resin/Amino curing agent | Graphite | Non-insulation, non-formation of corrugations |
| Comparative example 2 | Acrylic resin | General Boron Nitride | — | Oligomer having a hydroxyl group/Amino curing agent | Graphite | Non-insulation, Formation of corrugations |

Evaluation of Physical Properties

1) Measurement of Thermal Conductivity

Thermal conductivity of solar cells prepared in Examples 1 and 2 and Comparative Examples 1 and 2 was measured by a laser flash method (LFA 457 manufactured by NETZSCH).

2) Measurement of Heat Dissipation Properties

In order to evaluate the heat dissipation properties of solar cells prepared in Examples 1 and 2 and Comparative Examples 1 and 2, the solar cells were charged in a thermostat at a temperature of 25° C., and thermal energy was applied to the solar cells using an infrared light bulb of 1,000 W, such that a temperature of one surface coated with the heat dissipation paint composition was measured in real time.

By adopting a temperature that reached equilibrium without a temperature change, it was determined that the lower the temperature, the better the heat dissipation property of the solar cells.

3) Measurement of Surface Roughness and Surface Area

Surface roughness and a surface area of a coating layer formed of a heat dissipation paint composition in the manufactured solar cell were measured using a three-dimensional roughness meter (Vecco, model name: Wyko NT 9380).

The results of 1), 2), and 3) are summarized in Table 2 below.

TABLE 2

| Classification | Coating layer formed of thermal conductive and electrically insulating paint composition | | Coating layer formed of heat dissipation paint composition | | | *Solar cell efficiency (%) |
|---|---|---|---|---|---|---|
| | Thermal conductivity (W/m · K, 25° C.) | Electricity insulation Properties | Thermal conductivity (W/m · K, 25° C.) | Surface area (mm$^2$) | Temperature of surface of coating layer (° C.) | |
| Example 1 | 22.8 | ○ | 23.1 | 25.7 | 43.4 | 15.2 |
| Example 2 | 27.3 | ○ | 23.3 | 26.4 | 42.8 | 15.3 |
| Comparative example 1 | 23.2 | X | 17.5 | 17.3 | 47.6 | Short circuit |
| Comparative example 2 | 27.3 | X | 23.5 | 25.3 | 42.5 | Short circuit |

*Solar cell efficiency was measured with a solar simulator, and related details were carried out in accordance with KS C IEC 60904:2005. As shown in Table 2, the solar cells prepared in Examples 1 and 2 had high thermal conductivity and a surface area of a heat dissipation coating layer was wide, in a portion to which an exterior steel sheet for a solar cell was adhered, so a heat dissipation effect was excellent, and an increase in a temperature of the solar cell was significantly lowered, and there was an electrical insulation effect, confirming that efficiency of the solar cell was excellent. On the other hand, in the case of Comparative Examples 1 and 2, there was not an electric insulation effect, and all electricity generated in the solar cell was discharged, confirming that the efficiency of the solar cell decreased sharply.

Furthermore, in order to measure an effect of only the heat dissipation layer, a solar cell was manufactured in the same manner as in Example 1 using the thermal conductive and electrically insulating paint composition and a heat dissipation paint composition in the same manner as in Example 1, except that a urethane resin was used as a thermoplastic resin of the thermal conductive and electrically insulating paint composition, an oligomer of the heat dissipation paint composition was used as an epoxy resin, a curing agent was used as an isocyanate curing agent, and carbon black was used as an anisotropic filler In this case, the thermal conductivity, heat dissipation properties, and surface area were measured in the same manner as in the [Evaluation of physical properties], and the thermal conductivity of the coating layer formed by the thermal conductive and electrically insulating paint composition of the present disclosure was measured to be 22.9 W/m K at 25° C., electrical insulation properties was measured, but the thermal conductivity of the coating layer formed by the heat dissipation paint composition was significantly lowered to 16.6 W/m K at 25° C., the surface area was significantly decreased to 18.5 mm$^2$, since an oligomer containing a hydroxy or carboxy group was not used, a temperature of the heat dissipation layer was significantly increased to 48.2. Thus, efficiency of the solar cell decreased to 14.2%, confirming that the efficiency decreased by 1%.

Hereinafter, the present disclosure will be described more specifically through embodiments. It should be noted, however, that the following embodiments are intended to illustrate the present disclosure in more detail and not to limit the scope of the present disclosure. The scope of the present disclosure is determined by the matters set forth in the claims and the matters reasonably inferred therefrom.

DESCRIPTION OF REFERENCE NUMERALS

1: Solar cell protective film
2: Solar cell layer including CIGS solar cells
3: Stainless substrate
4: Thermal conductive and electrically insulating coating layer
5: Plated steel sheet
6: Heat dissipation layer

The invention claimed is:

1. An exterior steel sheet for a solar cell, comprising:
a steel sheet having a heat dissipation layer formed on one surface thereof; and
a thermal conductive and electrically insulating coating layer formed on the other surface of the steel sheet, the coating layer including a thermoplastic resin, a thermal conductive filler and a polymeric dispersant, wherein the thermal conductive filler is dispersed in the coating layer in a form of being encompassed by the polymeric dispersant,
wherein the polymeric dispersant is 1 to 3 parts by weight per 100 parts by weight of the thermal conductive filler, and
wherein the coating layer has a thickness of greater than 5 μm and less than 10 μm, wherein the heat dissipation layer comprises a mixture comprising an oligomer having a hydroxyl group or a carboxyl group and an amino curing agent, an acid catalyst, and an anisotropic filler.

2. The exterior steel sheet for a solar cell of claim 1, wherein the heat dissipation layer has corrugations protruding outwardly in a thickness direction of the steel sheet, and comprises an anisotropic filler in the protruding corrugations, wherein the anisotropic filler being oriented outwardly in the thickness direction of the steel sheet.

3. The exterior steel sheet for a solar cell of claim 2, wherein the anisotropic filler is oriented by following a protrusion direction of the corrugations.

4. The exterior steel sheet for a solar cell of claim 1, wherein the heat dissipation layer has a thickness of 10 to 30 μm.

* * * * *